(12) United States Patent
Lin et al.

(10) Patent No.: US 7,602,037 B2
(45) Date of Patent: Oct. 13, 2009

(54) HIGH VOLTAGE SEMICONDUCTOR DEVICES AND METHODS FOR FABRICATING THE SAME

(75) Inventors: Yi-Chun Lin, Hsinchu (TW); Chi-Chih Chen, Hsinchu (TW); Kuo-Ming Wu, Hsinchu (TW); Ruey-Hsin Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 93 days.

(21) Appl. No.: 11/692,213

(22) Filed: Mar. 28, 2007

(65) Prior Publication Data

US 2008/0237703 A1    Oct. 2, 2008

(51) Int. Cl.
*H01L 27/088*    (2006.01)
*H01L 29/06*    (2006.01)

(52) U.S. Cl. .................. 257/492; 257/335; 257/339; 257/343; 257/E29.012; 257/E29.256

(58) Field of Classification Search ................. 257/335, 257/339, 343, E29.012, E29.256, 492
See application file for complete search history.

(56) References Cited

U.S. PATENT DOCUMENTS

| 6,303,961 | B1 * | 10/2001 | Shibib .................. 257/335 |
| 7,262,471 | B2 * | 8/2007 | Pan et al. .............. 257/368 |
| 2002/0117714 | A1 * | 8/2002 | Hebert ................. 257/339 |
| 2005/0006701 | A1 | 1/2005 | Sung et al. |
| 2006/0170056 | A1 | 8/2006 | Pan et al. |

* cited by examiner

*Primary Examiner*—Ngan Ngo
*Assistant Examiner*—Benjamin Tzu-Hung Liu
(74) *Attorney, Agent, or Firm*—Thomas, Kayden, Horstemeyer & Risley

(57) ABSTRACT

An exemplary embodiment of a semiconductor device capable of high-voltage operation includes a substrate with a well region therein. A gate stack with a first side and a second side opposite thereto, overlies the well region. Within the well region, a doped body region includes a channel region extending under a portion of the gate stack and a drift region is adjacent to the channel region. A drain region is within the drift region and spaced apart by a distance from the first side thereof and a source region is within the doped body region near the second side thereof. There is no P-N junction between the doped body region and the well region.

19 Claims, 13 Drawing Sheets

1400

_US 7,602,037 B2_

HIGH VOLTAGE SEMICONDUCTOR DEVICES AND METHODS FOR FABRICATING THE SAME

BACKGROUND OF THE INVENTION

1. Field of the Invention

The invention relates to integrated circuit fabrication, and more particularly to semiconductor devices capable of sustaining high-voltage and methods for fabricating the same.

2. Description of the Related Art

In current integrated circuit processing, controllers, memories, low-voltage (LV) circuits and high-voltage (HV) power devices are largely integrated into a single chip, referred to as a single-chip system. For example, to handle high voltage and current, a DDD (double diffused drain) structure is often used as a source or drain in a high voltage metal oxide semiconductor (HVMOS) transistor. A DDD structure also, in addition to preventing "hot carrier" problems, provides a high breakdown voltage to a HVMOS transistor.

These DDD structures can be formed through a variety of well-known methods. Referring to FIG. 1A, a substrate with an N-well 101 is provided with isolation regions 103 formed thereon. A transistor gate stack 105 is formed on the N-well 101. A source/drain region 111 can be formed by a first implantation. A second implantation and thermal annealing can then form the completed DDD structure 113. That is, in order to obtain a lightly doped P type DDD region of sufficient length, a lengthy thermal drive-in is required. The length of the thermal drive-in, however, also causes a short channel effect and is thus reducing the channel length for scaling is difficult. A semiconductor device having the conventional DDD transistor requires a large cell pitch and is therefore disadvantageous when the size of the semiconductor device is reduced.

Double-diffused metal oxide semiconductor (DMOS) transistors, frequently used as conventional power devices, can operate with low on-resistance while sustaining high voltage. Lateral double-diffused metal oxide semiconductor (LDMOS) transistors in particular have a simple structure suitable for incorporation into VLSI logic circuits, however, they are considered inferior to vertically double-diffused metal oxide semiconductor (VDMOS) transistors because they have high on-resistance. Recently, reduced surface field (RESURF) LDMOS devices, capable of providing low on-resistance, have been introduced and are increasingly used in power devices.

Referring to FIG. 1B a conventional LDMOS device is illustrated in an integrated circuit or semiconductor device 20 with a p-type drain 224 spaced apart from a gate 216 having spacers 220. The transistor is formed over a substrate 240, where a p-type epitaxial (epi) silicon layer 260 is formed over an n-buried layer (NBL) 280. An N-well 212 is formed in the P type epi layer 260, and field oxide isolation structures 210 are formed to isolate the transistor.

A p+ source 222 is formed in the N-well 212 along one side of a channel region 228 of the N-well 212. A P+ drain 224 is formed in the P epi layer 260. The transistor gate stack 216 is formed over the channel region 228 of the N-well 212, which also partially overlies a portion of the P type epi layer 260.

In operation, the spacing of the drain 224 and the channel 228 spreads out the electric fields, thereby increasing the breakdown voltage rating of the device. However, the drain extension increases the resistance of the drain-to-source current path (Rdson), whereby LDMOS device designs often involve a tradeoff between high breakdown voltage BVdss and low Rdson.

The N-well 212 is formed using an implant mask and drive-in process prior to forming the gate stacks 216, to integrate the previously described HVMOS transistor process with the LVMOS transistor process. Thus, a channel length of the channel region 228 is increased improperly during the drive-in process, eventually increasing on-resistance of the LDMOS transistor.

An improved semiconductor device ameliorating the disadvantages of the conventional technology including difficulties sustaining fixed channel length, higher breakdown voltage or lower on-resistance, improving device performance without significantly adding to the cost or complexity of the manufacturing process, and capable of high-voltage operation is desirable.

BRIEF SUMMARY OF THE INVENTION

A detailed description is given in the following embodiments with reference to the accompanying drawings.

High voltage semiconductor devices are provided. An exemplary embodiment of a semiconductor device capable of high-voltage operation comprises a substrate with a well region therein. A gate stack with a first side and a second side opposite thereto, overlies the well region. Within the well region, a doped body region comprises a channel region extending under a portion of the gate stack and a drift region is adjacent to the channel region. A drain region is within the drift region and spaced apart by a distance from the first side thereof and a source region is within the doped body region near the second side thereof. There is no P-N junction between the doped body region and the well region.

Another exemplary embodiment of a semiconductor device capable of high-voltage operation comprises a substrate with a well region therein. A gate stack with a first side and a second side opposite thereto, overlies the well region. A doped body region, within the well region, comprises a channel region extending under a portion of the gate stack and has no P-N junction between the doped body region and the well region. A first drift region is adjacent to the channel region and at least laterally extends under the first side thereof. A drain region is spaced apart by a distance from the first side thereof and a source region is within the doped body region near the second side thereof. A second drift region surrounds the drain region, comprising a junction adjacent to the first drift region and between the first side thereof and the drain region.

Another exemplary embodiment of a semiconductor device capable of high-voltage operation comprises a P-type substrate and an N-well region therein. A gate stack with a first side and a second side opposite thereto, overlies the N-well region. Within the N-well region, an N type doped body region comprises a channel region extending under a portion of the gate stack. There is no P-N junction between the N type doped body region and the N-well region. A P type first drift region is adjacent to the channel region and at least laterally extends under the first side thereof. A drain region is spaced apart by a distance from the first side thereof. A source region is within the N type doped body region near the second side thereof. A P type second drift region surrounds the drain region, comprising a junction adjacent to the P type first drift region and between the first side thereof and the drain region. First and second spacers are disposed on the first and second sides of the gate stack respectively. And a lightly doped region is under the second spacer and between the source region and the channel region.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The invention relates generally to semiconductor device fabrication and more particularly to structures and methods for a semiconductor device capable of high-voltage operation. The invention will now be described with respect to embodiments in a specific context, namely the creation of a MOSFET device. It is believed that embodiments of this invention are particularly advantageous when used in this process. It is believed that embodiments described herein will benefit other applications not specifically mentioned. Therefore, the specific embodiments discussed are merely illustrative of specific ways to make and use the invention, and do not limit the scope of the invention.

FIGS. 2-6 illustrate an exemplary embodiment of a method for fabricating a semiconductor device such as an HVMOS with reduced size and improved electrical performance.

Figure 1A:
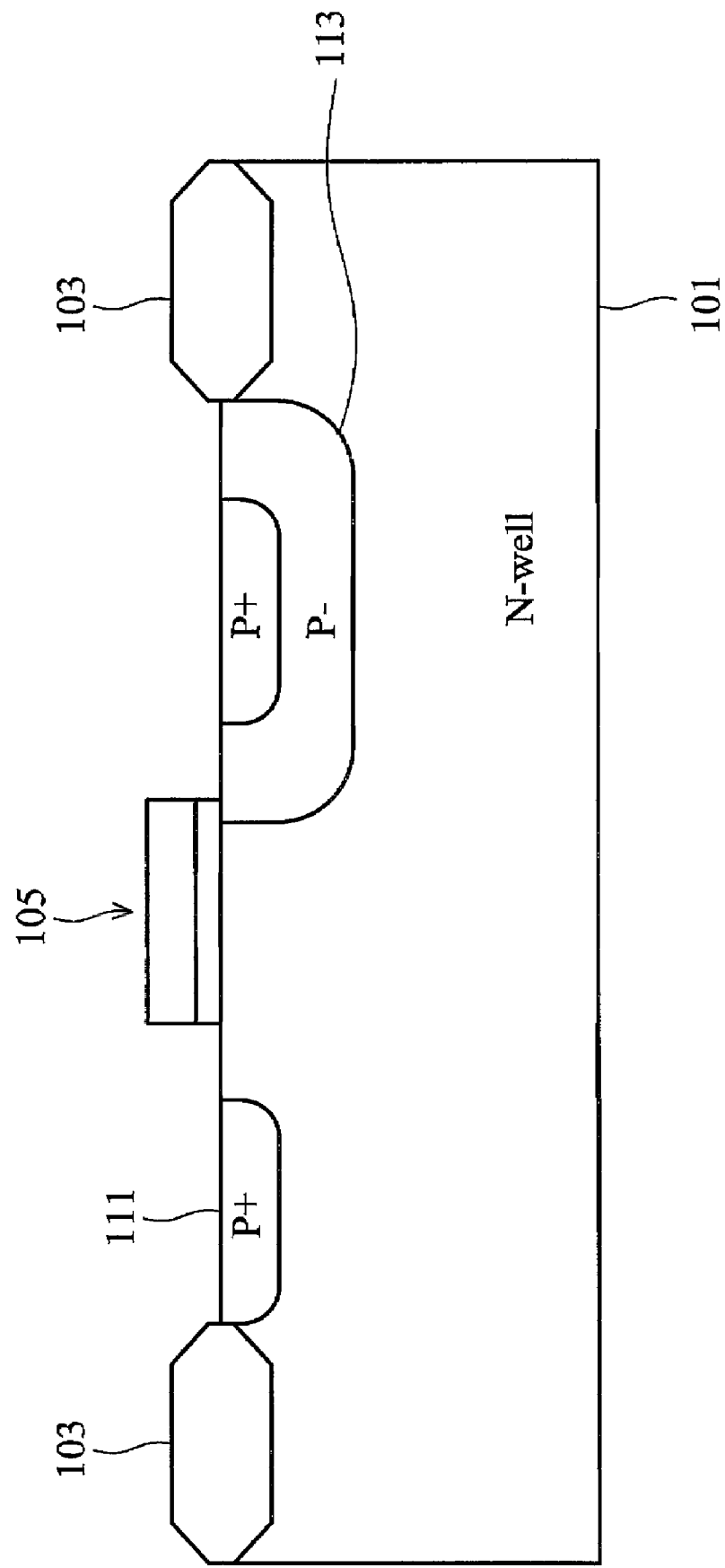
FIG. 1A is a schematic cross section illustrating a semiconductor device including a DDD MOS transistor of the related art.
Figure 1B:
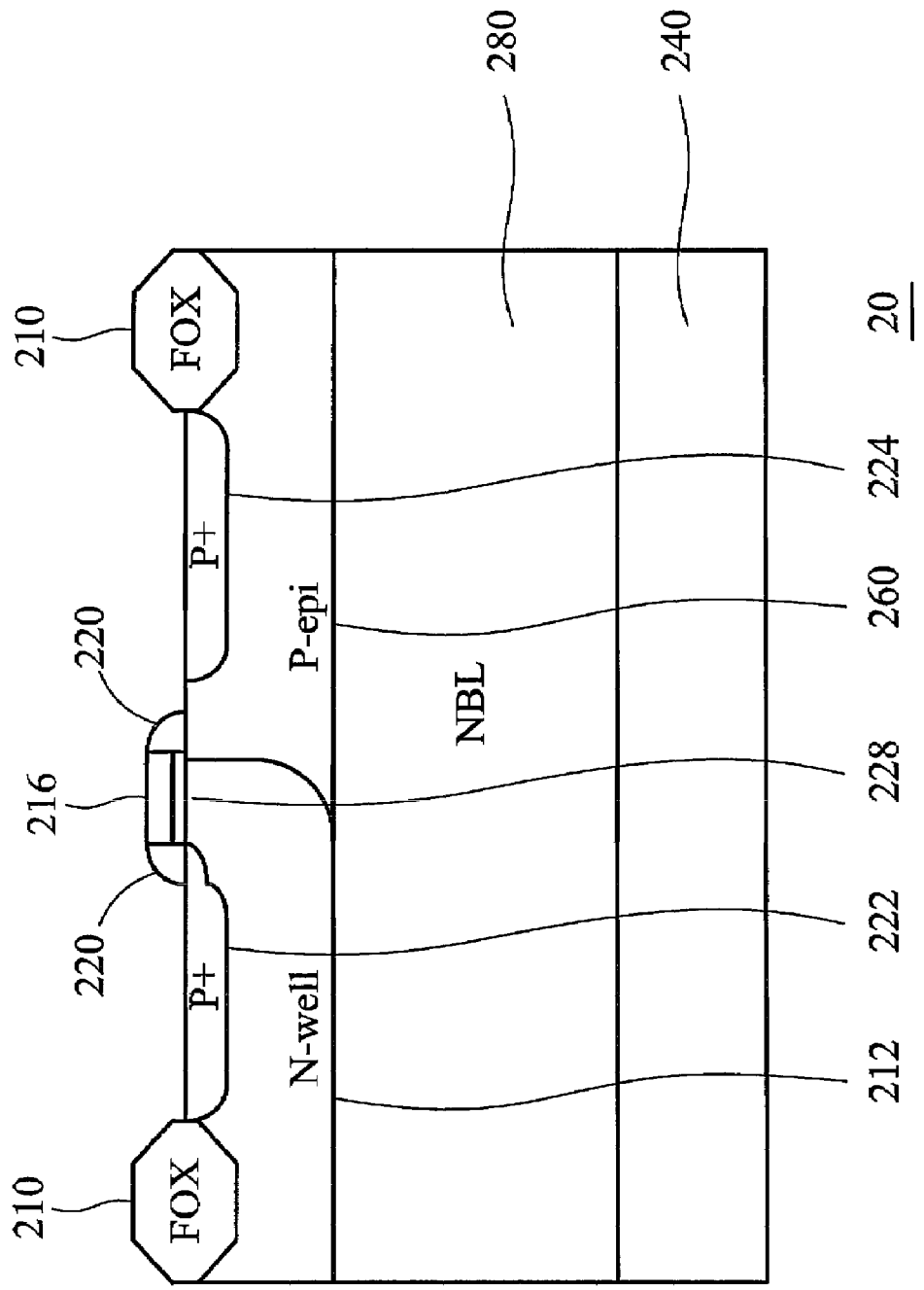
FIG. 1B is a schematic cross section illustrating a semiconductor device including a LDMOS transistor of the related art.
Figure 2:
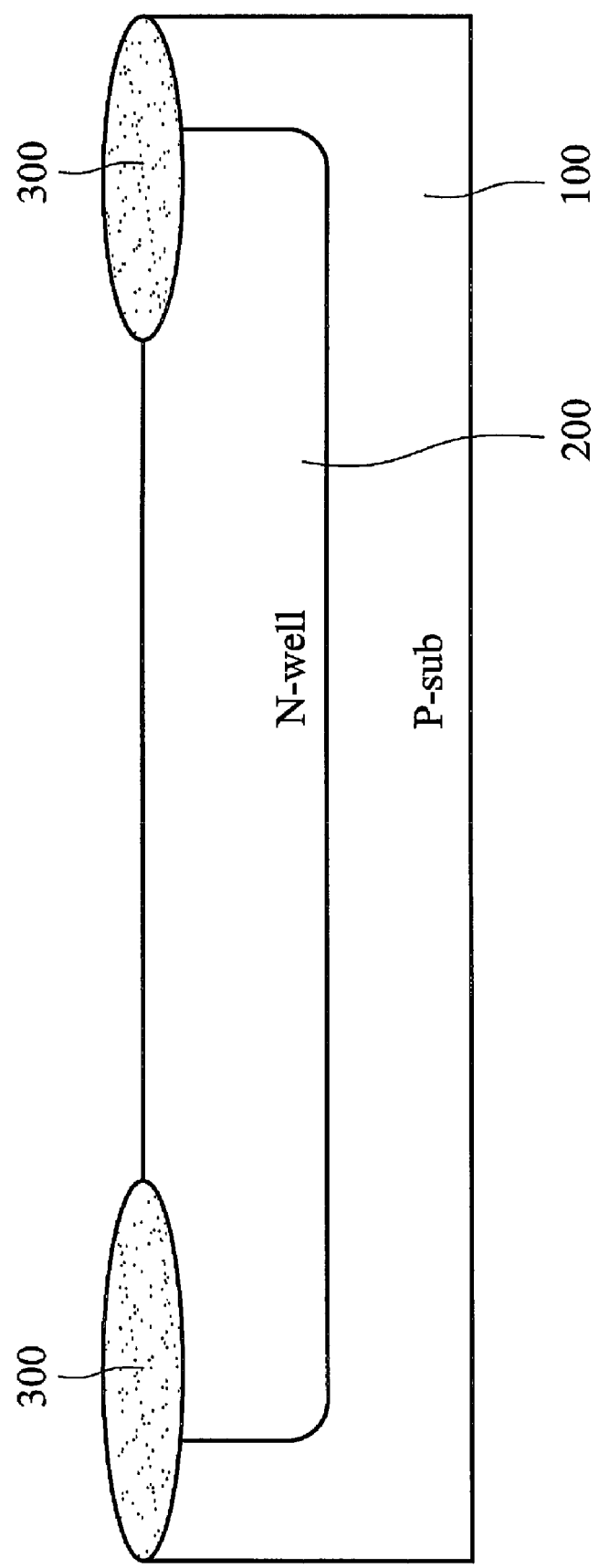
FIGS. 2-6 are schematic cross sections illustrating a method for forming a semiconductor device according to an embodiment of the invention.

FIG. 2 illustrates the process of forming a semiconductor substrate 100 with a well region 200 therein. The semiconductor substrate 100 may comprise a silicon on insulator (SOI) substrate, a bulk silicon substrate or silicon epitaxy layer formed over a substrate. The semiconductor substrate 100 can be formed with a first conductive type such as P-type or N-type conductivity. In this case, the semiconductor substrate 100 is a P type silicon substrate for forming a PMOS transistor.

Generally, isolation structures 300 are formed on the substrate 100 to define an active area, such as a high voltage region. The isolation structures 300 in FIG. 2 are illustrated as field oxide (FOX) regions here but are not limited thereto; other isolation structures such as conventional shallow trench isolation (STI) structures can be also adopted.

Next, a well region 200 is formed in the substrate 100, having a conductive type opposite to that of the substrate 100. For example, a high voltage N-well region 200 may be formed by implanting an N-type dopant such as phosphorous to a doping concentration of about 1E12 atoms/cm$^2$ to about 1E13 atoms/cm$^2$. Other N-type dopants such as arsenic, nitrogen, antimony, combinations thereof, or the like, can also be used alternatively. Formation of the well region 200 can be achieved by a well implantation method using a patterned implant mask (not shown).

Figure 3:
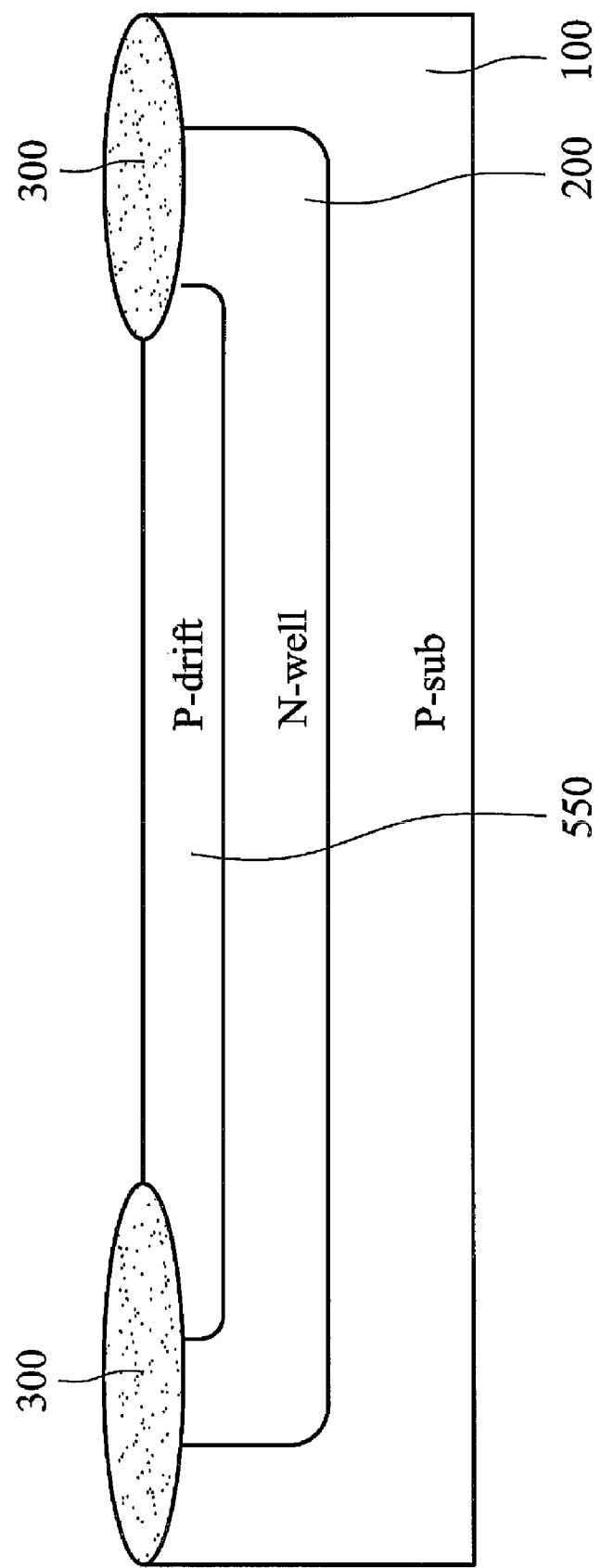

FIG. 3 illustrates the process of forming a drift region 550 by implanting impurities into the well region 200. Preferably, the drift region 550 is formed in an upper portion of the well region, creating a junction between the well region 200 and the drift region 550. Generally, the drift region 550 has a conductive type opposite to that of the well region 200. For example, a P type drift region 550 may be formed by implanting a P-type dopant such as boron at a concentration of about 1E12 atoms/cm$^2$ to about 1E13 atoms/cm$^2$. Other P type dopants such as gallium, aluminum, indium, combinations thereof, or the like, can, also be used alternatively.

Figure 4:
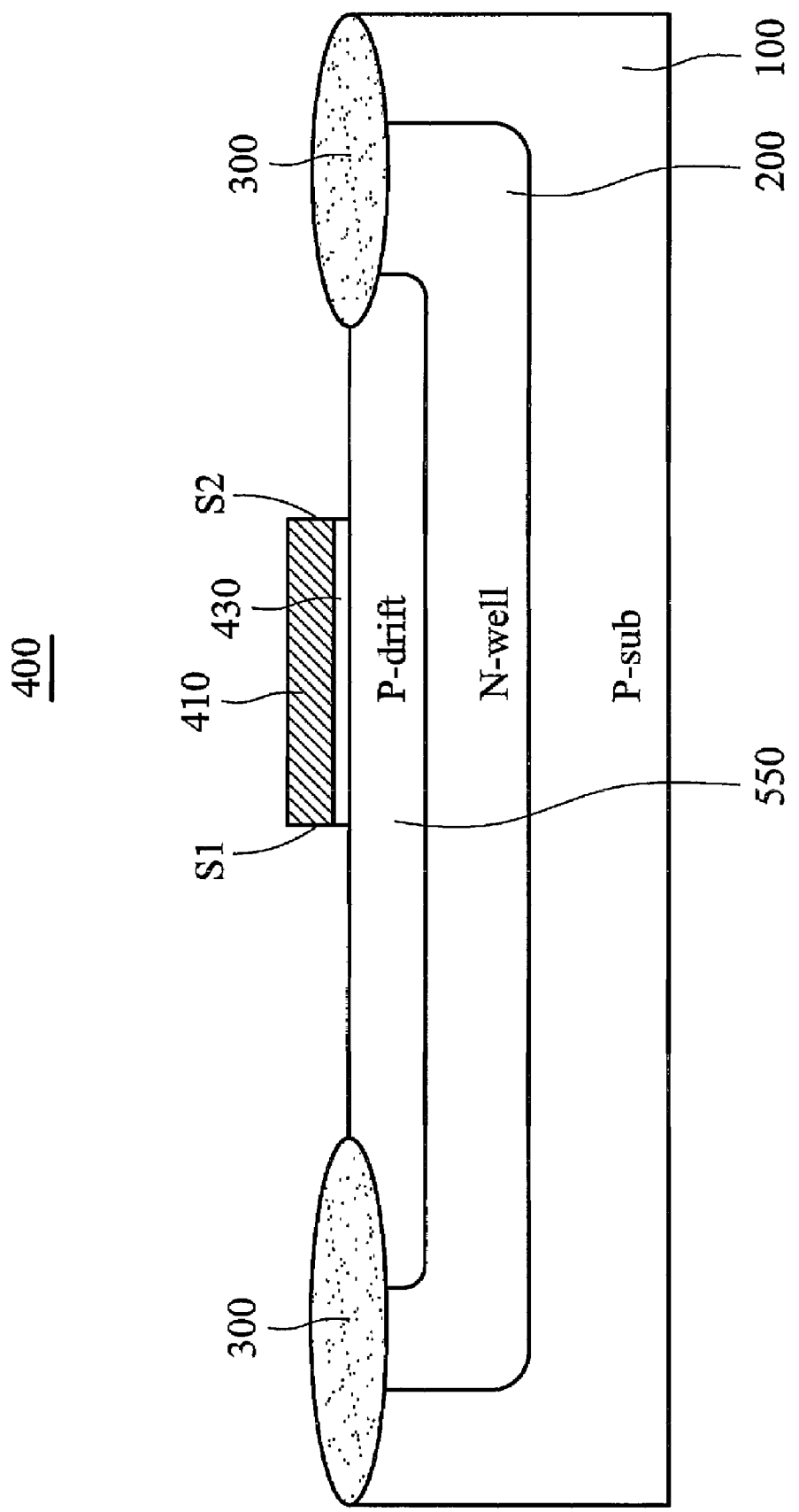

FIG. 4 illustrates the process of forming a gate stack 400 with a first side S1 and a second side S2 opposite thereto, overlying the well region 200 or the drift region 550. For example, a gate dielectric 430 is deposited over a portion of the drift region 550. Typically, the gate dielectric 430 may formed by using a thermal oxidation process. A gate conductor 410 is deposited over the gate dielectric 430, by using a chemical vapor deposition process, as an example. The gate conductor 410 comprises a conductor layer such as a doped polysilicon, metal, metal alloy or the like. Optionally, a surface of the gate conductor 410 may be silicided.

Figure 5:
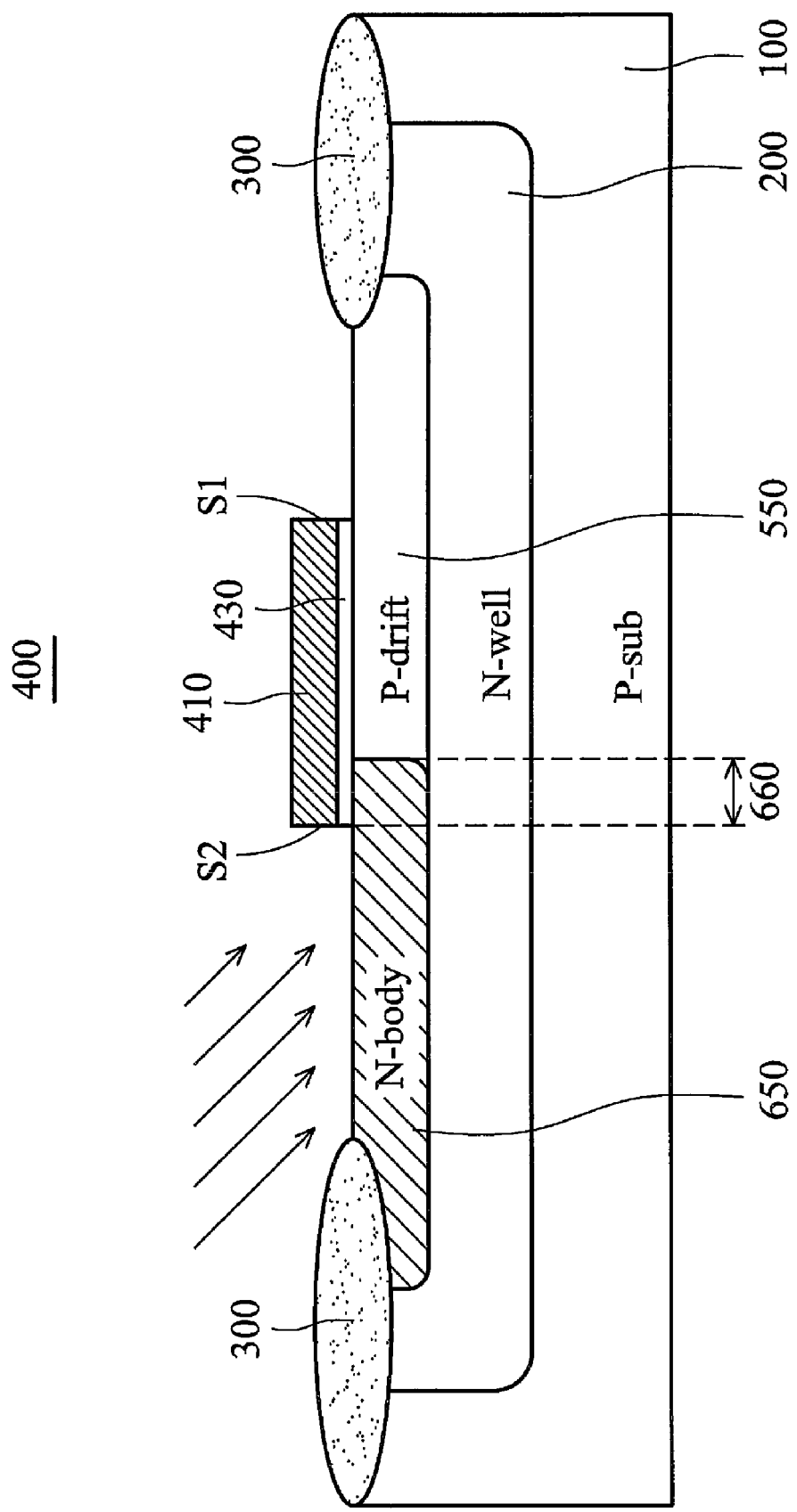

Referring to FIG. 5, a doped body region 650, having a conductive type opposite to that of the drift region 550, is formed in the drift region 550. For example, an N type doped body region 650 may be formed by implanting an N type dopant such as phosphorous to a doping concentration of about 1E13 atoms/cm$^2$ to about 1E14 atoms/cm$^2$. Other N type dopants such as arsenic, nitrogen, antimony, combinations thereof, or the like, can also be used alternatively. Formation of the doped body region 650 can be achieved by using a Large Angle Tilt Implant (LATID) from a single side. In this case, during the LATID process, a patterned implant mask (not shown), masks an exposed substrate surface of the first side S1. The angle of the implant is increased up to 60 degrees from vertical. As a result, after the LATID process, a portion of the P type drift region 550 is reversed to form the N type doped body region 650 of the second side S2. Specifically, the doped body region 650 extends to or beyond the bottom junction of the drift region 550 such that a depth of the doped body region 650 is at least equal to or deeper than the portion of the drift region 550 and thus there is no P-N junction formed between the doped body region 650 and the well region 200. Simultaneously, a channel region 660 extends under a portion of the gate stack 400 from the second side S2 is also defined. Preferably, the doped body region 650 is formed after the gate stack 400 and the drift region 550 and can be achieved by using a LATID process without requiring a drive-in step. Thus, a channel length of the channel region 660 can be fixed at a desirable size.

Optionally, the dimensions and dopant concentrations of the N type doped body region 650, the high-voltage N-well region 200, and the P type drift region 550 can be set to improve surface electric field in accordance with the reduced surface field (RESURF) technique, thus allowing for an even greater increased breakdown voltage of the overall device.

Figure 6:
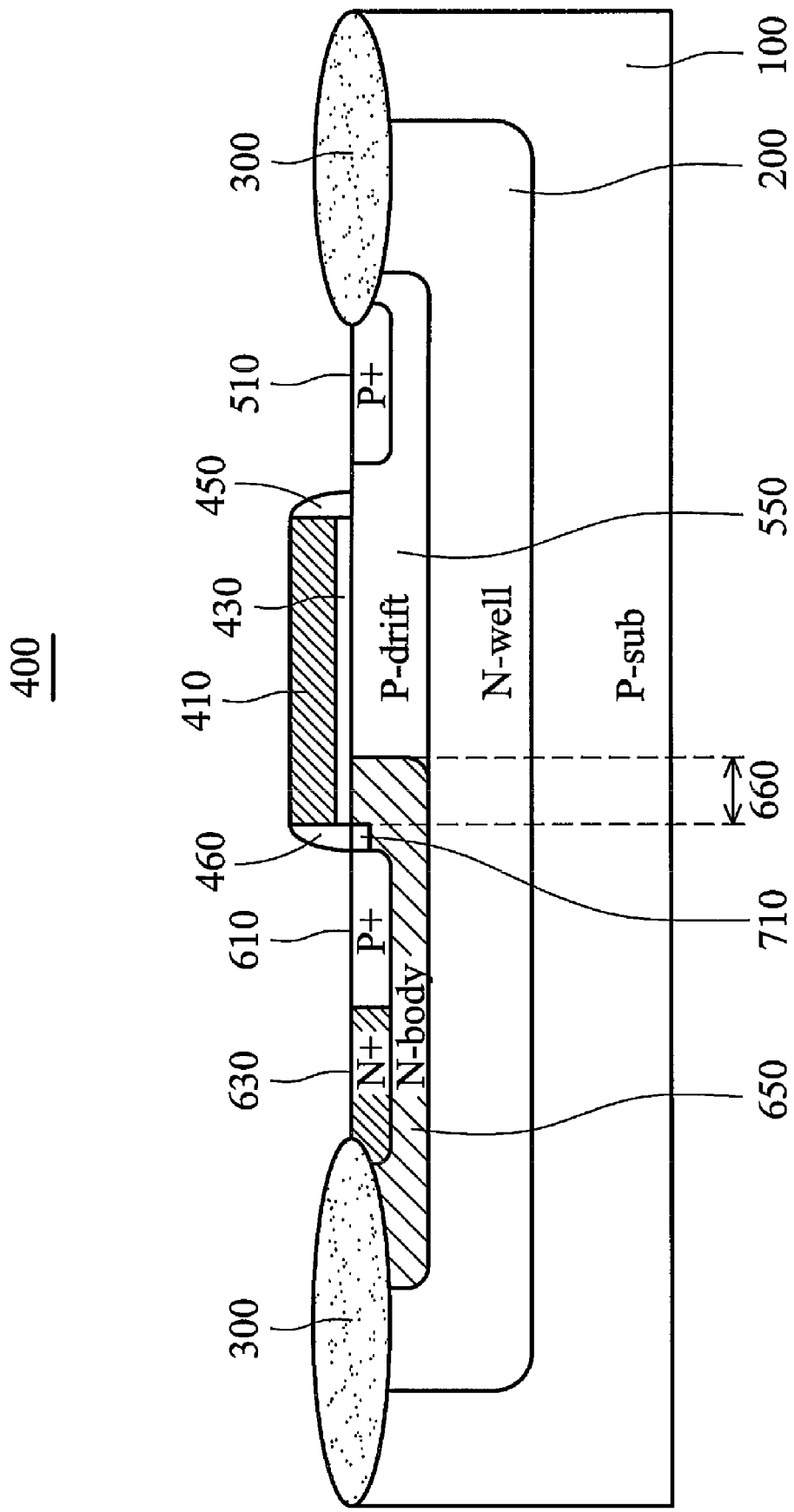

FIG. 6 illustrates the process of forming a source region 610 in the doped body region 650 and a drain region 510 in the drift region 550, within the N-well region 200.

First, a lightly doped region (LDD) implant may be used when defining the source region 610 and drain region 510 of the MOS structure. Specifically, the implant places the LDD dopant just to the edge of the channel region 660 to provide a gradual dopant concentration to the source region 610. In one example, a P type lightly doped region implant may use a medium to low dose implant to dope a P-type dopant such as boron at a concentration of about 1E13 atoms/cm$^2$ to about 1E14 atoms/cm$^2$. Other P type dopants such as gallium, aluminum, indium, combinations thereof, or the like, can also be used alternatively.

Secondly, first and second spacers 450 and 460 are formed on the first and second sides S1 and S2 of the gate stack 400 respectively. For example, a dielectric layer may be conformably formed on the gate stack 400 and the substrate 100. In an exemplary embodiment, the dielectric layer includes a liner oxide layer and a nitride layer. In alternative embodiments, the dielectric layer includes a single layer, which preferably comprises oxide, silicon nitride, silicon oxynitride, and/or other dielectric materials. And then, the dielectric layer is patterned to form spacers 450 and 460 on the first and second sides S1 and S2 thereof.

Next, a P+ source region 610 in the N type doped region 650 may be formed by implanting a P-type dopant such as boron at a concentration of about 1E14 atoms/cm$^2$ to about 1E16 atoms/cm$^2$. Other P type dopants such as gallium, aluminum, indium, combinations thereof, or the like, can also be used alternatively. Simultaneously, a P type lightly doped region 710 is also formed under the second spacer S2 between the P+ source region 610 and the channel region 660 in a high voltage PMOS transistor.

On the other hand, a P+ drain region 510 spaced apart by a distance from the spacer 450 may also be formed by implanting a P-type dopant such as boron at a concentration of about 1E14 atoms/cm$^2$ to about 1E16 atoms/cm$^2$. Other P type dopants such as gallium, aluminum, indium, combinations thereof, or the like, can also be used alternatively.

Further, a body contact region 630 is formed adjacent the P+ source region 610 in the doped body region 650. For example, an N type body contact region 630 may be formed by implanting an N-type dopant such as phosphorous to a doping concentration of about 1E14 atoms/cm$^2$ to about 1E16 atoms/cm$^2$. Other N-type dopants such as arsenic, nitrogen, antimony, combinations thereof, or the like, can also be used alternatively.

In an alternative embodiment, an impurity concentration of the N type doped body region 650 may be substantially larger than that of the N-well region 200 for lowering the on-resistance. An impurity concentration of the P type drift region 550 may also be substantially smaller than that of the drain region 510 or the P type lightly doped region 710 for higher breakdown voltage.

FIGS. 7-11 illustrate another exemplary embodiment of a method for fabricating a semiconductor device including an HVMOS with reduced size and improved electrical performance.

Figure 7:
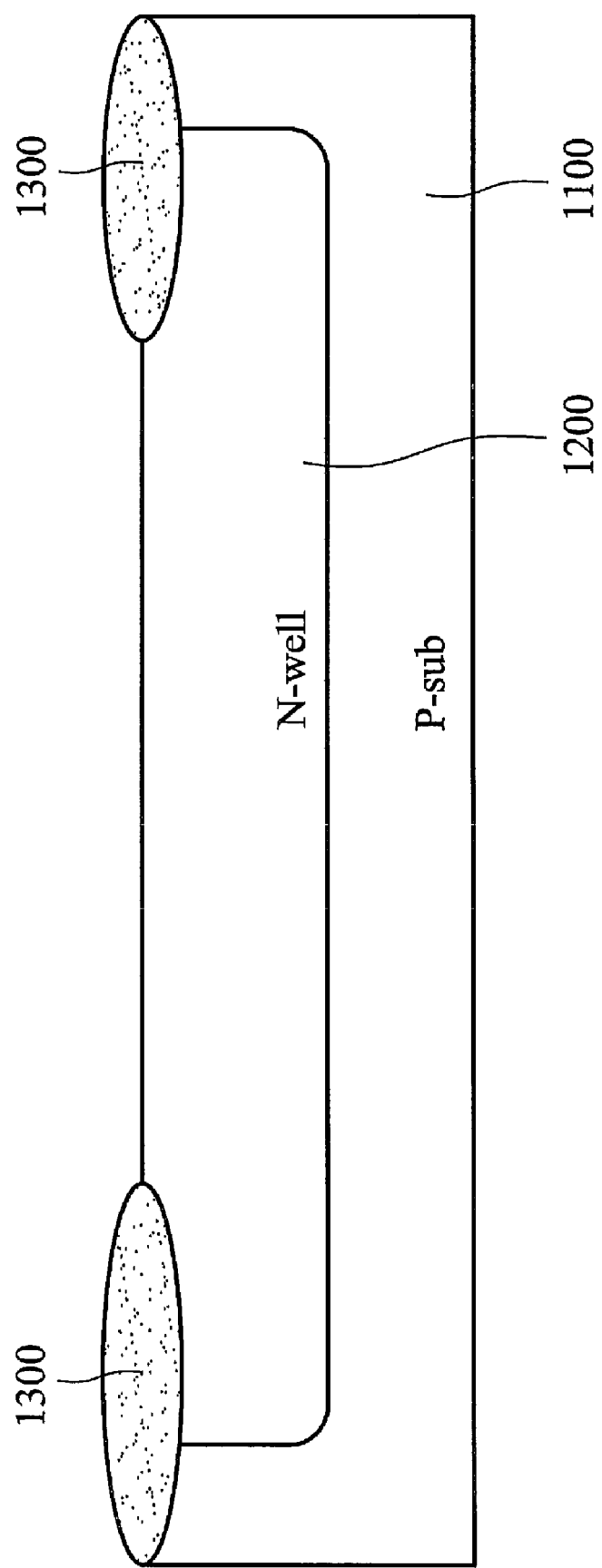
FIGS. 7-12 are schematic cross sections illustrating a method for forming a semiconductor device according to an embodiment of the invention.

FIG. 7 illustrates the process of forming a semiconductor substrate 1100 with a well region 1200 therein. The semiconductor substrate 1100 may comprise a silicon on insulator (SOI) substrate, a bulk silicon substrate or silicon epitaxy layer formed over a substrate. The semiconductor substrate 1100 can be formed with a first conductive type such as P-type or N-type conductivity.

Isolation structures 1300 are typically formed on the substrate 1100 to define an active area, such as a high voltage region. The isolation structures 1300 in FIG. 7 are illustrated as field oxide (FOX) regions here but are not limited thereto; other isolation structures such as conventional shallow trench isolation (STI) structures can be also used.

Next, a well region 1200, having a conductive type opposite to that of the substrate 1100, is formed in the substrate 1100. For example, a high voltage N-well region 1200 may be formed by implanting an N-type dopant such as phosphorous to a doping concentration of about 1E12 atoms/cm$^2$ to about 1E13 atoms/cm$^2$. Other N-type dopants such as arsenic, nitrogen, antimony, combinations thereof, or the like, can also be used alternatively. Formation of the well region 1200 can be achieved by a well implantation method using a patterned implant mask (not shown).

Figure 8:
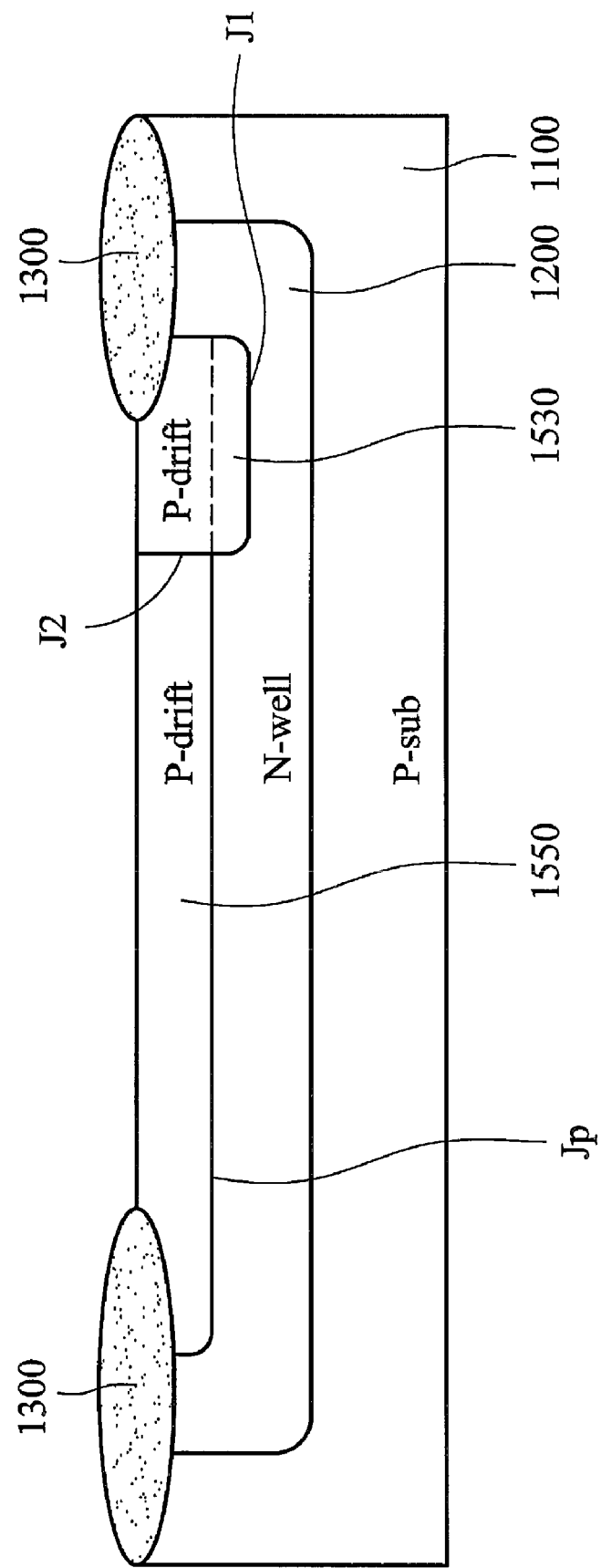

FIG. 8 illustrates the process of forming a drift region 1550 by implanting impurities into the well region 1200. Preferably, the drift region 1550 is formed in an upper portion of the well region, such that a junction Jp between the well region 1200 and the drift region 1550 is created. Typically, the drift region 1550 has a conductive type opposite to that of the well region 1200. For example, a P type drift region 1550 may be formed by implanting a P-type dopant such as boron at a concentration of about 1E12 atoms/cm$^2$ to about 1E13 atoms/cm$^2$. Other P type dopants such as gallium, aluminum, indium, combinations thereof, or the like, can also be used alternatively.

Optionally, FIG. 8 further illustrates the process of forming a second drift region 1530, comprising a junction J2 adjacent to the first drift region 1550. Preferably, the second drift region 1530 is formed in the first drift region 1550 and may extend out to the well region 1200, such that a first junction J1 between the well region 1200 and the second drift region 1530 and a second junction J2 between the first drift region 1550 and the second drift region 1530 are created. The second drift region 1530 has a conductive type opposite to that of the well region 1200. For example, a P type drift region 1530 may be formed by implanting a P-type dopant such as boron at a concentration of about 1E12 atoms/cm$^2$ to about 1E14 atoms/cm$^2$. Other P type dopants such as gallium, aluminum, indium, combinations thereof, or the like, can also be used alternatively.

Figure 9:
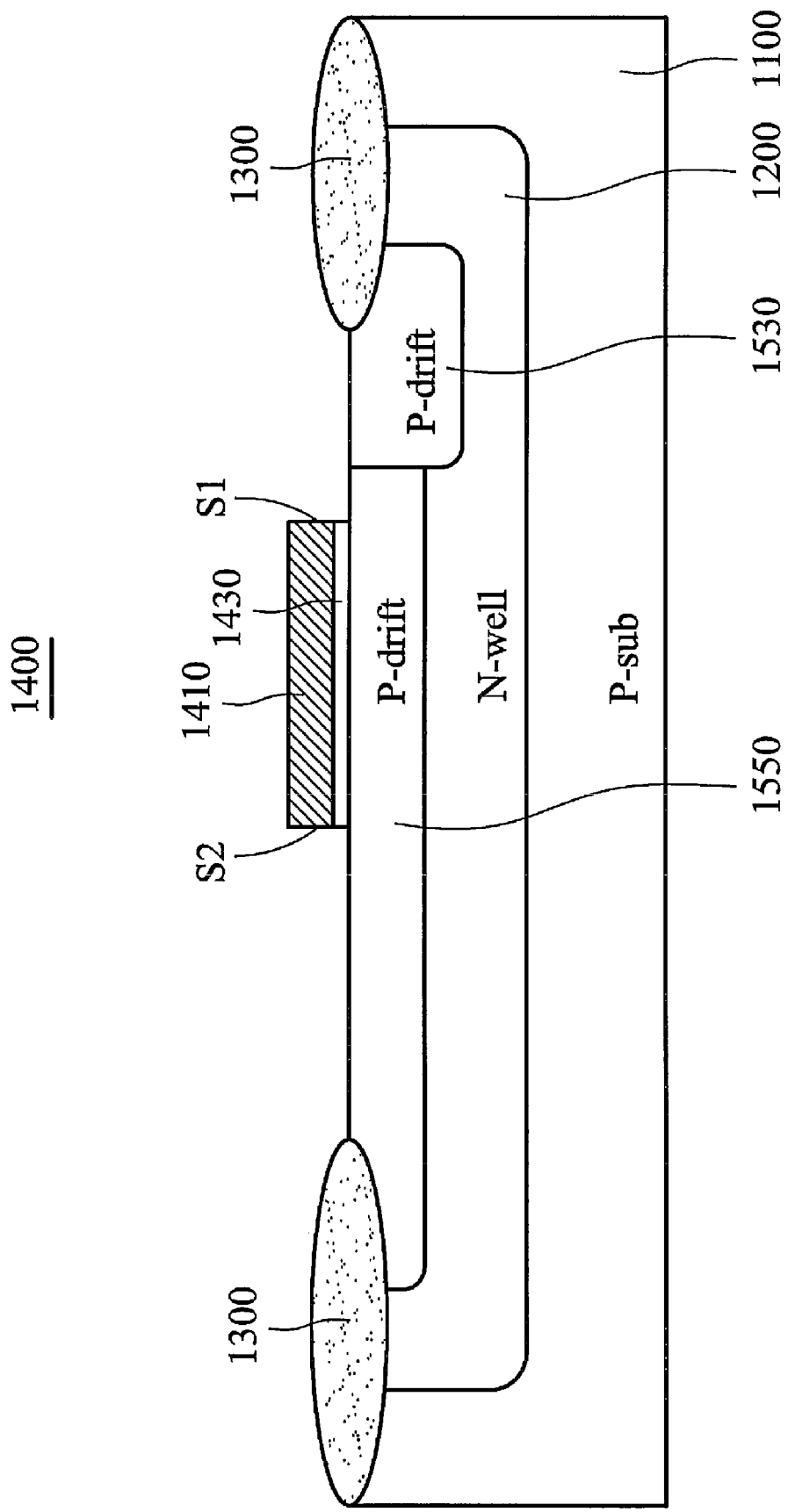

FIG. 9 illustrates the process of forming a gate stack 1400 with a first side S1 and a second side S2 opposite thereto, overlying the well region 1200 or the drift region 1550. Specifically, the drift region 1550 at least laterally extends under the first side S1 of the gate stack 1400. In one example, a gate dielectric 1430 is deposited over a portion of the drift region 1550. Typically, the gate dielectric 1430 may formed by using a thermal oxidation process. A gate conductor 1410 is deposited over the gate dielectric 1430, by a chemical vapor deposition process, for example. The gate conductor 1410 comprises a conductor layer such as a doped polysilicon, metal, metal alloy or the like. Optionally, a surface of the gate conductor 1410 may be silicided.

One skilled in the art will realize that the sequence for forming gate stack 1400 and second drift region 1530 can be reversed. That is, the second drift region 1530 can be formed before or after the gate stack 400 is formed.

Figure 10:
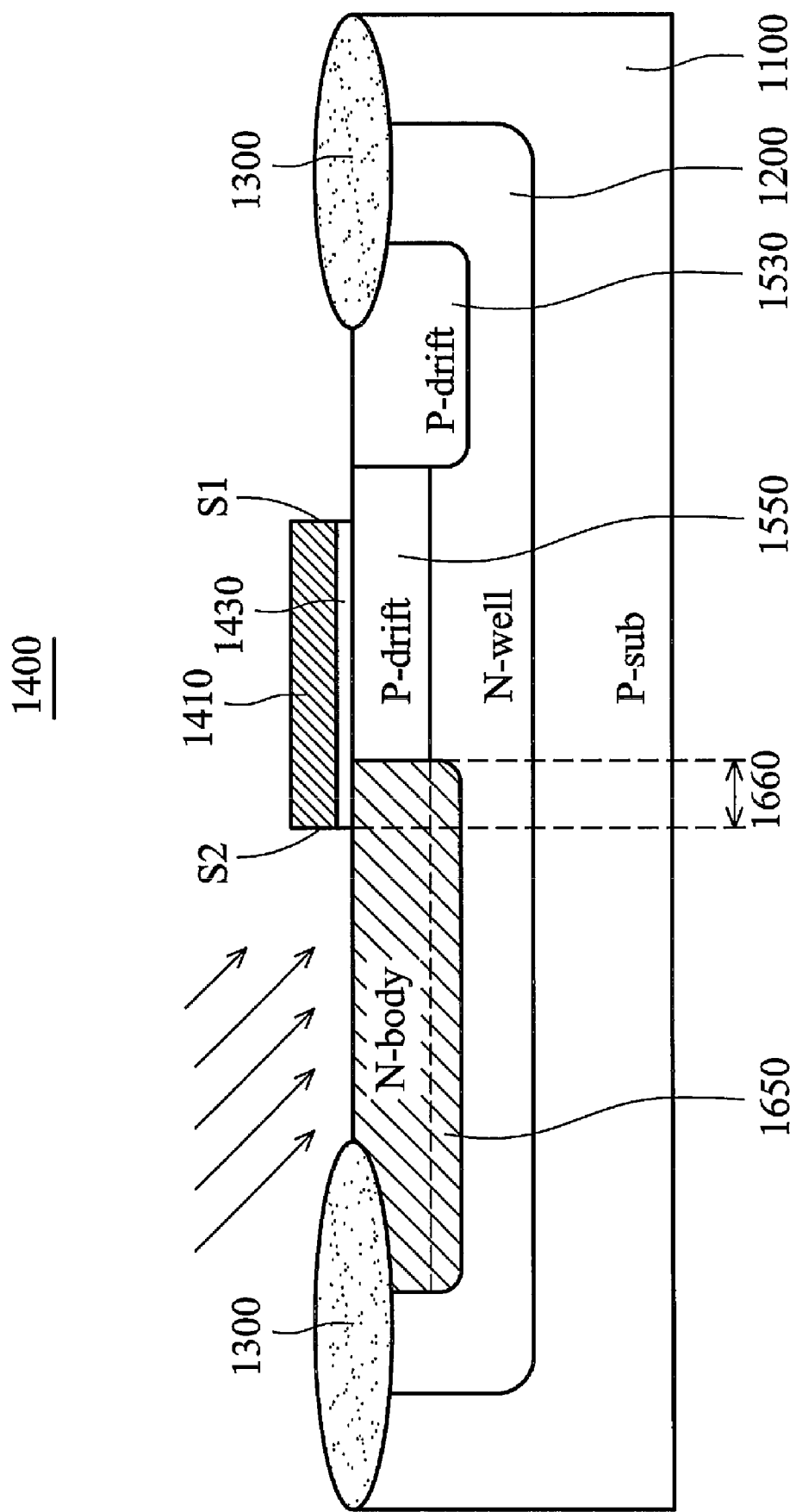

Referring to FIG. 10, a doped body region 1650 is formed in the first drift region 1550, having a conductive type opposite to that of the first drift region 1550. For example, an N type doped body region 1650 may be formed by implanting an N type dopant such as phosphorous to a doping concentration of about 1E13 atoms/cm$^2$ to about 1E14 atoms/cm$^2$. Other N type dopants such as arsenic, nitrogen, antimony, combinations thereof, or the like, can also be used alternatively. Formation of the doped body region 1650 can be achieved by using a Large Angle Tilt Implant LATID) from a single side. In this case, during the LATID process, a patterned implant mask (not shown) masks an exposed substrate surface of the first side S1. The angle of the implant is increased to 60 degrees from vertical. As a result, after the LATID process, a portion of the P type drift region 1550 is reversed to form the N type doped body region 1650 of the second side S2. Specifically, the doped body region 1650 extends to or beyond the bottom junction of the drift region 1550 such that a depth of the doped body region 1650 is at least equal to or deeper than the portion of the drift region 1550. Thus P-N junction is not formed between the doped body region 1650 and the well region 1200. Simultaneously, a channel region 1660 extends under a portion of the gate stack 1400 from the second side S2 is also defined. Preferably, the doped body region 1650 is formed after the gate stack 1400 and the drift region 1550 and can be achieved by using a Large Angle Tilt Implant (LATID) process without any drive-in step. Thus, a channel length of the channel region 1660 can be fixed in a desirable size.

Optionally, the dimensions and dopant concentrations of the N type doped body region 1650, the high-voltage N-well region 1200, and the first and second P type drift region 1550 and 1530 can be set to improve surface electric field in accordance with the reduced surface field (RESURF) technique, thus allowing for an even larger increased breakdown voltage of the overall device.

Figure 11:
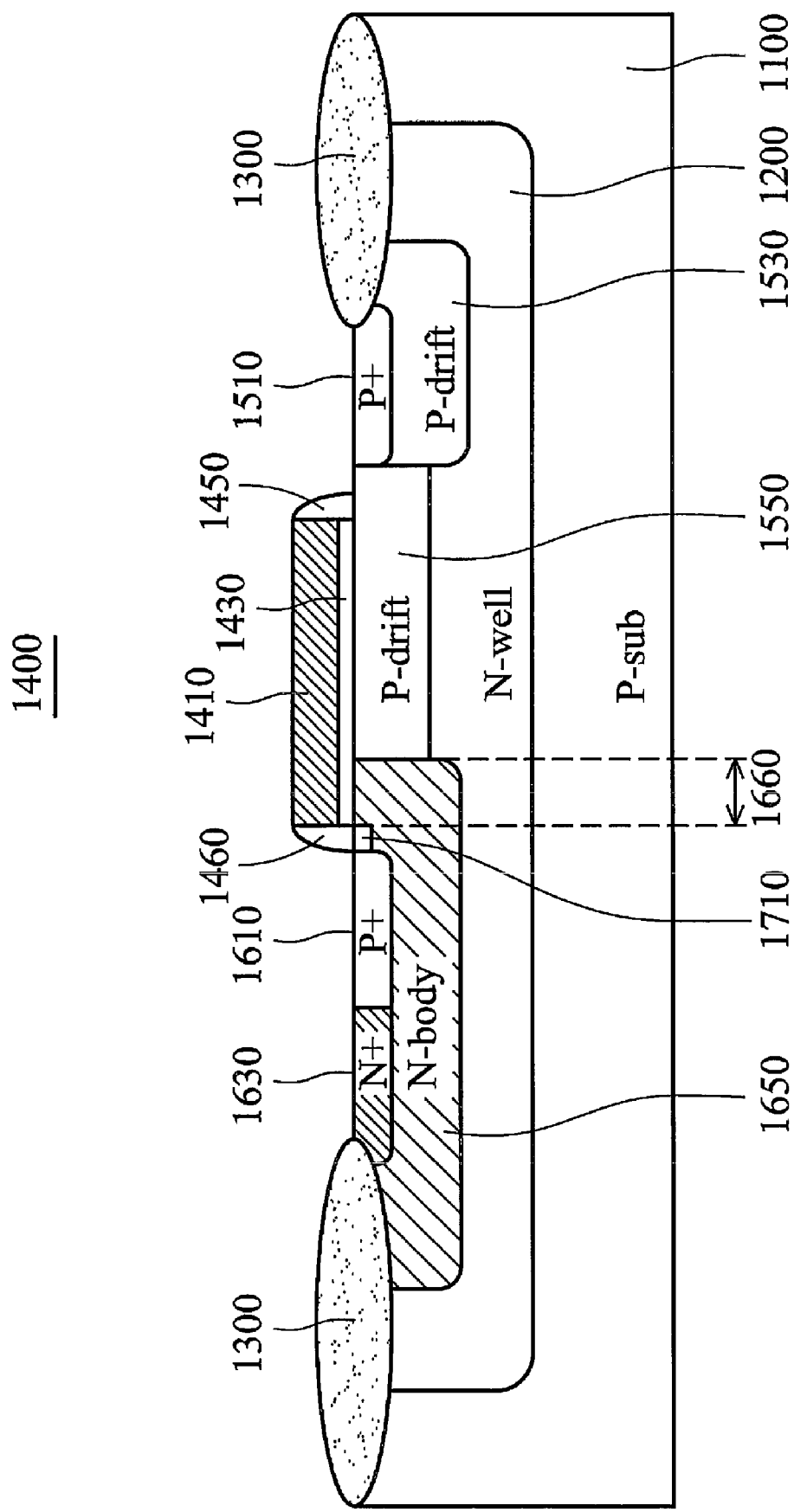

FIG. 11 illustrates the process of forming a source region 1610 in the doped body region 1650 and a drain region 1510 in the second drift region 1530, within the N-well region 1200.

First, a lightly doped region (LDD) implant may be used when defining the source region 1610 and drain region 1510 of the MOS structure. Specifically, the implant places the LDD dopant just to the edge of the channel region 1660 to provide a gradual dopant concentration to the source region 1610. In one example, a P type lightly doped region implant may use a medium to low dose implant to dope a P-type dopant such as boron at a concentration of about 1E13 atoms/$cm^2$ to about 1E14 atoms/$cm^2$. Other P type dopants such as gallium, aluminum, indium, combinations thereof, or the like, can also be used alternatively.

First and second spacers 1450 and 1460 are then formed on the first and second sides S1 and S2 of the gate stack 1400 respectively. For example, a dielectric layer may be conformably formed on the gate stack 1400 and the substrate 1100. In an exemplary embodiment, the dielectric layer includes a liner oxide layer and a nitride layer. In alternative embodiments, the dielectric layer includes a single layer, which preferably comprises oxide, silicon nitride, silicon oxynitride, and/or other dielectric materials. The dielectric layer is then patterned to form spacers 1450 and 1460 on the first and second sides S1 and S2 thereof.

Next, a P+ source region 1610 in the N type doped region 1650 may be formed by implanting a P-type dopant such as boron at a concentration of about 1E14 atoms/$cm^2$ to about 1E16 atoms/$cm^2$. Other P type dopants such as gallium, aluminum, indium, combinations thereof, or the like, can also be used alternatively. Simultaneously, a P type lightly doped region 1710 is also defined under the second spacer S2 between the P+ source region 1610 and the channel region 1660 in a high voltage PMOS transistor.

On the other hand, a P+ drain region 1510 spaced apart by a distance from the spacer 1450 may also be formed by implanting a P-type dopant such as boron at a concentration of about 1E14 atoms/$cm^2$ to about 1E16 atoms/$cm^2$. Other P type dopants such as gallium, aluminum, indium, combinations thereof, or the like, can also be used alternatively.

Further, a body contact region 1630 is formed adjacent the P+ source region 1610 in the doped body region 1650. For example, an N type body contact region 1630 may be formed by implanting an N-type dopant such as phosphorous to a doping concentration of about 1E14 atoms/$cm^2$ to about 1E16 atoms/$cm^2$. Other N-type dopants such as arsenic, nitrogen, antimony, combinations thereof, or the like, can also be used alternatively.

In an alternative embodiment, an impurity concentration of the N type doped body region 1650 may be substantially smaller than that of the N+ body contact region 1630 but substantially larger than that of the N-well region 1200 for lowering the on-resistance Additionally, an impurity concentration of the second P type drift region 1530 may be substantially smaller than that of the drain region 1510 or the P type lightly doped region 1710 but substantially larger than that of the first P type drift region 1550 for lowering the on-resistance.

In one example, the second drift region 1530 is deeper than the first drift region 1550, as shown in FIG. 11. In this case, an increase in the depth of the drift region 1530 can lead to an improvement of the on-resistance and the breakdown voltage, since the larger junction area of the second drift region 1530 can lower a junction resistance and effectively distribute a current passing through the junction.

Figure 12:
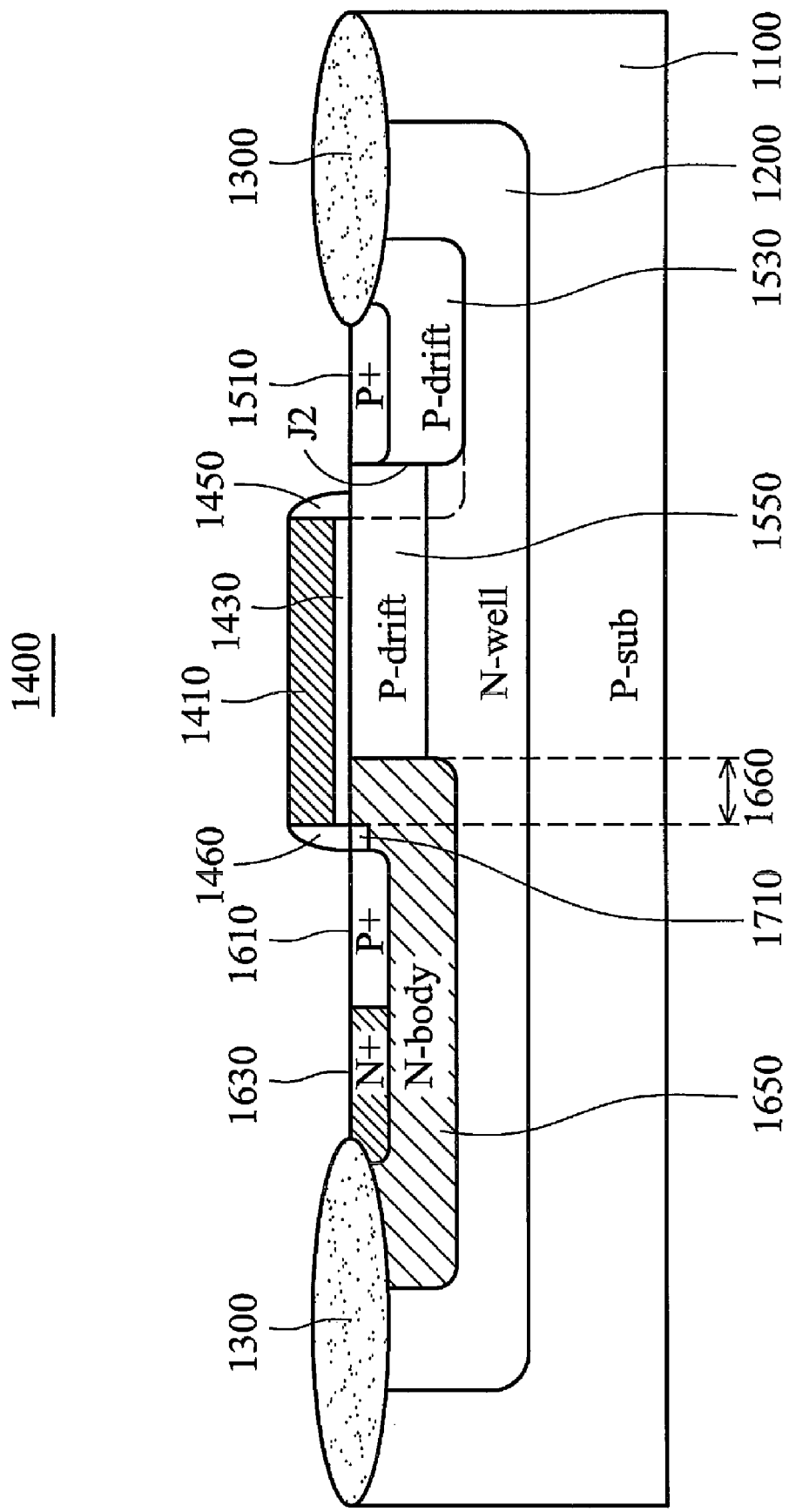

Further referring to FIG. 12, illustrates the possible position of the junction J2 between the first drift region 1550 and the second drift region 1530. For lowering the on-resistance, the junction J2 can be formed near the first side S1 of the gate stack 1400. On the other hand, the junction J2 may tend to near the P+ drain region 1510 when higher breakdown voltage is needed.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device capable of high-voltage operation, comprising:
    a substrate, comprising a well region therein;
    a gate stack with a first side and a second side opposite thereto, overlying the well region;
    a doped body region, within the well region and comprising a channel region extending under a portion of the gate stack;
    a drift region, within the well region and adjacent to the channel region, wherein the drift region has a depth shallower than the doped body region;
    a drain region, within the drift region and spaced apart by a distance from the first side thereof;
    a source region, within the doped body region near the second side thereof, wherein there is no P-N junction between the doped body region and the well region; and
    a body contact region, within the doped body region and adjacent to the source region.

2. The semiconductor device of claim 1, further comprising first and second spacers, on the first and second sides of the gate stack respectively.

3. The semiconductor device of claim 2, further comprising a lightly doped region, under the second spacer and between the source region and the channel region.

4. The semiconductor device of claim 3, wherein an impurity concentration of the lightly doped region is substantially larger than that of the drift region.

5. The semiconductor device of claim 1, wherein the semiconductor device is a PMOS device.

6. The semiconductor device of claim 1, wherein the drift region is doped with an impurity of a first conductivity type, and the doped body region and the well region are doped with an impurity of a second conductivity type opposite to the first conductivity type.

7. The semiconductor device of claims 1, wherein an impurity concentration of the doped body region is substantially larger than that of the well region.

8. The semiconductor device of claim 1, wherein an impurity concentration of the drain region is substantially larger than that of the drift region.

9. A semiconductor device capable of high-voltage operation, comprising:
  a substrate, comprising a well region therein;
  a gate stack with a first side and a second side opposite thereto, overlying the well region;
  a doped body region, within the well region and comprising a channel region extending under a portion of the gate stack, wherein there is no P-N junction between the doped body region and the well region;
  a first drift region, adjacent to the channel region and at least laterally extending under the first side of, wherein the first drift region has a depth shallower than the doped body region;
  a drain region, spaced apart by a distance from the first side thereof;
  a source region, within the doped body region near the second side thereof; and
  a second drift region, surrounding the drain region and comprising a junction adjacent to the first drift region, wherein the junction is between the first side thereof and the drain region, the first drift region has the depth shallower than the second drift region.

10. The semiconductor device of claim 9, further comprising first and second spacers, on the first and second sides of the gate stack respectively.

11. The semiconductor device of claim 10, further comprising a lightly doped region, under the second spacer and between the source region and the channel region.

12. The semiconductor device of claim 11, wherein an impurity concentration of the second drift region is substantially smaller than that of the lightly doped region and is substantially larger than that of the first drift region.

13. The semiconductor device of claim 9, wherein the semiconductor device is a PMOS device.

14. The semiconductor device of claim 9, wherein the first and second drift region is doped with an impurity of a first conductivity type, and the doped body region and the well region are doped with an impurity of a second conductivity type opposite thereto.

15. The semiconductor device of claims 9, wherein an impurity concentration of the doped body region is substantially larger than that of the well region.

16. The semiconductor device of claim 9, wherein an impurity concentration of the second drift region is substantially smaller than that of the drain region and is substantially larger than that of the first drift region.

17. A semiconductor device capable of high-voltage operation, comprising:
  a P-type substrate, comprising a N-well region therein;
  a gate stack with a first side and a second side opposite thereto, overlying the well region;
  an N type doped body region, within the N-well region and comprising a channel region extending under a portion of the gate stack, wherein there is no P-N junction between the N type doped body region and the N-well region;
  a P type first drift region, adjacent to the channel region and at least laterally extending under the first side thereof, wherein the P type first drift region has a depth shallower than the N type doped body region;
  a drain region, spaced apart by a distance from the first side thereof;
  a source region, within the N type doped body region near the second side thereof;
  a P type second drift region, surrounding the drain region and comprising a junction adjacent to the P type first drift region, wherein the junction is between the first side thereof and the drain region, the P type first drift region has the depth shallower than the P type second drift region;
  first and second spacers, on the first and second sides of the gate stack respectively; and
  a lightly doped region, under the second spacer and between the source region and the channel region.

18. The semiconductor device of claim 17, wherein an impurity concentration of the P type second drift region is substantially smaller than that of the lightly doped region and is substantially larger than that of the P type first drift region.

19. The semiconductor device of claim 17, wherein an impurity concentration of the N type doped body region is substantially larger than that of the N-well region.

* * * * *